(12) United States Patent
Wang et al.

(10) Patent No.: US 7,763,945 B2
(45) Date of Patent: Jul. 27, 2010

(54) STRAINED SPACER DESIGN FOR PROTECTING HIGH-K GATE DIELECTRIC

(75) Inventors: Chih-Hao Wang, Hsinchu (TW); Shang-Chih Chen, Hsinchu (TW)

(73) Assignee: Taiwan Semiconductor Manufacturing Co., Ltd., Hsin-Chu (TW)

(*) Notice: Subject to any disclaimer, the term of this patent is extended or adjusted under 35 U.S.C. 154(b) by 111 days.

(21) Appl. No.: 11/736,755

(22) Filed: Apr. 18, 2007

(65) Prior Publication Data

US 2008/0258227 A1    Oct. 23, 2008

(51) Int. Cl.
    *H01L 31/119*   (2006.01)
(52) U.S. Cl. .................. 257/369; 257/338; 257/351; 257/E27.108
(58) Field of Classification Search .................. 257/369, 257/338, 351, E27.108
    See application file for complete search history.

(56) References Cited

U.S. PATENT DOCUMENTS 6,797,572 B1 *  9/2004  Jeon et al. .................. 438/287
2004/0262784 A1 * 12/2004 Doris et al. .................. 257/900
2006/0017098 A1 *  1/2006 Doczy et al. ................. 257/330
2006/0208250 A1 *  9/2006 Sun et al. ...................... 257/19
2008/0061366 A1 *  3/2008 Liu et al. ..................... 257/336

\* cited by examiner

*Primary Examiner*—Lynne A Gurley
*Assistant Examiner*—Samuel A Gebremariam
(74) *Attorney, Agent, or Firm*—Thomas, Kayden, Horstemeyer & Risley

(57) ABSTRACT

A semiconductor device pair is provided. The semiconductor device pair comprises a semiconductor substrate comprising a first gate structure with a first type polarity and a second gate structure with a second type polarity, the first and the second gate structures comprise a high-K gate dielectric. A plurality of oxygen-free offset spacer portions are adjacent either side of the respective first and second gate structures, each comprising a stressed dielectric layer, to induce a desired strain on a respective channel region while sealing respective high-K gate dielectric sidewall portions, wherein the oxygen-free offset spacer portions adjacent either side of the first gate structure and the oxygen-free offset spacer portions adjacent either side of the second gate structure are formed with different shapes.

17 Claims, 4 Drawing Sheets

STRAINED SPACER DESIGN FOR PROTECTING HIGH-K GATE DIELECTRIC

BACKGROUND

This invention generally relates to processes for forming semiconductor device integrated circuits including MOSFET devices and more particularly to a pair of MOSFET devices having opposite polarity and enhanced device performance provided by selectively forming an offset spacer portion and a strained L-shaped spacer portion which have the benefits of controlling a desired strain on the channel region as well as protecting high-K gate dielectrics from sub-oxide formation under gate edge region.

As MOSFET device feature sizes are scaled below 0.25 microns including below 0.1 micron, new methods have been proposed for forming and more precisely locating offset spacers to aid in forming doped regions producing MOSFETs having better short channel effect and desired device characteristics, for example reducing short channel effects (SCE) such that we can get better threshold voltage ($V_T$) roll-off, drain induced barrier lowering (DIBL), and subthreshold swing variation.

There is therefore a continuing need in the semiconductor device integrated circuit manufacturing art for improved spacers and methods for forming the same to improve device performance regardless of device polarity. Also, in a high-K device, oxygen may diffuse into a high-K dielectric layer and forms a sub-oxide layer, thereby degrading performances thereof.

It is therefore an object of the present invention to provide an offset and a strained L-shaped spacers, and methods for forming the same to improve device performance regardless of device polarity and to protect sub-oxide formation, while overcoming other shortcomings of the prior art.

SUMMARY

To achieve the foregoing and other objects, and in accordance with the purposes of the present invention, as embodied and broadly described herein, the present invention provides an offset spacer and a strained L-shaped spacer for selectively inducing a channel strain, while protecting high-K gate dielectric layers from sub-oxide formation, and method of forming the same.

In an exemplary embodiment of a semiconductor device pair, the semiconductor device pair comprises a semiconductor substrate comprising a first gate structure with a first type polarity and a second gate structure with a second type polarity, the first and the second gate structures comprise a high-K gate dielectric. A plurality of oxygen-free offset spacer portions are adjacent either side of the respective first and second gate structures, each comprising a stressed dielectric layer, to induce a desired strain on a respective channel region while sealing respective high-K gate dielectric sidewall portions, wherein the oxygen-free offset spacer portions adjacent either side of the first gate structure and the oxygen-free offset spacer portions adjacent either side of the second gate structure are formed with different shapes.

An exemplary embodiment of a semiconductor device comprises a semiconductor substrate comprising an NMOS gate structure and a PMOS gate structure formed thereon, each comprising a high-K gate dielectric. A compressive stressed dielectric layer is formed over a sidewall of the NMOS gate structure and a PMOS gate structure, wherein the compressive stressed dielectric layer is oxygen-free and seals the high-K gate dielectric edge in the NMOS/PMOS gate structure, the compressive stressed dielectric layer formed over the sidewall of the NMOS gate structure is I-shaped, and the compressive stressed dielectric layer formed over the sidewall of the PMOS gate structure is L-shaped.

Another exemplary embodiment of a semiconductor device comprises a semiconductor substrate comprising an NMOS gate structure and a PMOS gate structure formed thereon, each comprising a high-K gate dielectric. A tensile stressed dielectric layer is formed over a sidewall of the NMOS gate structure and a PMOS gate structure, wherein the tensile stressed dielectric layer is oxygen-free and seals the high-K gate dielectric in the NMOS/PMOS gate structure, the tensile stressed dielectric layer formed over the sidewall of the NMOS gate structure is L-shaped, and the tensile stressed dielectric layer formed over the sidewall of the PMOS gate structure is I-shaped.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DESCRIPTION

The following description is of the best-contemplated mode of carrying out the invention. This description is made for the purpose of illustrating the general principles of the invention and should not be taken in a limiting sense. The scope of the invention is best determined by reference to the appended claims.

Although the method and device of the present invention are explained by reference to an exemplary NMOS and PMOS device pair, it will be appreciated that the method and device of the present invention may be applied in general to a pair of NMOS and PMOS devices where the device performance of the NMOS and PMOS device may be improved by selectively straining a respective channel region while simultaneously protecting (sealing) high-K dielectric gate layers from sub-oxide formation to degrade equivalent oxide thickness (EOT).

Figure 1A:
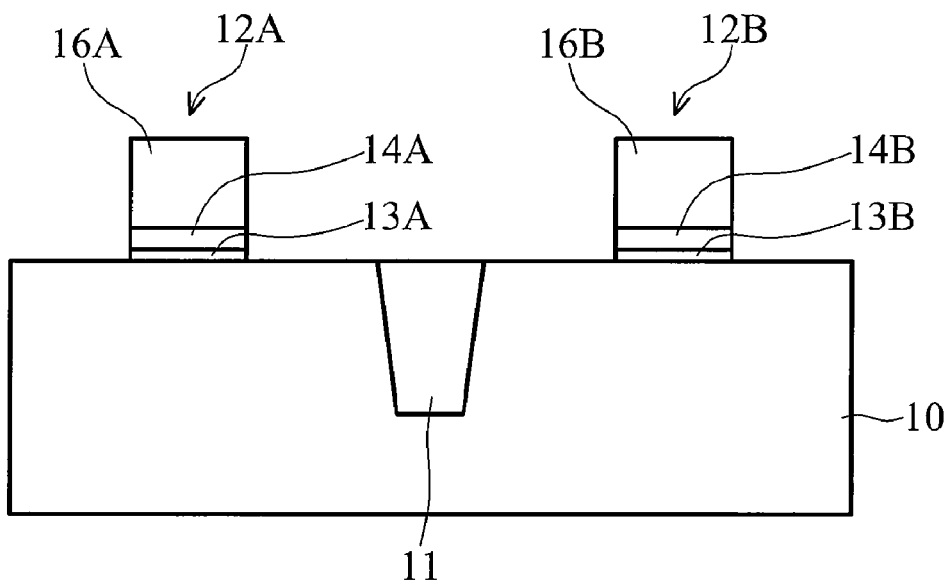
FIGS. 1A-1E are cross sectional views including a portion of a gate structure of an exemplary MOSFET pair showing exemplary manufacturing stages according to an embodiment of the present invention.

Referring to FIG. 1A is shown substrate 10, having overlying gate structures 12A and 12B, for example including a gate dielectric portions, 14A and 14B, and overlying gate electrode portions, 16A and 16B. The gate dielectric portions and overlying gate electrode portions are formed by conventional deposition, lithographic and etching processes. The substrate 10, for example, may include, but is not limited to, silicon, germanium, silicon-germanium, silicon on insulator (SOI), silicon-germanium on insulator (SiGeOI), germanium on insulator (GeOI), strained silicon on insulator (S—SOI), strained silicon-germanium on insulator (S—SiGeOI), or combinations thereof. An electrical isolation feature such as a shallow trench isolation (STI) structure 11 may be provided between the gate structures 12A and 12B prior to formation of the gate structures by conventional processes including etching a trench in the semiconductor substrate and backfilling the trench with a dielectric insulating material such as silicon oxide, oxynitride, or nitride.

Still referring to FIG. 1A, the gate structures 12A and 12B as well as gate dielectric portions 14A and 14B, and gate electrode portions 16A and 16B, may be formed by conventional CVD deposition, lithographic patterning, and plasma (dry) etching methods known in the art. In a preferred embodiment, the gate dielectric is a high-K dielectric layer, e.g., 14A and 14B, formed over a lowermost interfacial layer e.g., 13A and 13B, the interfacial layer being formed of an oxide, oxynitride, or nitride more preferably a thermally grown silicon dioxide layer. In some case, to scale down equivalent oxide thickness (EOT) of gate dielectric, the lowermost interfacial layer can be ignored or skipped due to its lower K (K<8). By the term "high-K" is meant having a dielectric constant greater than about 8, more preferably greater than about 10. The uppermost high-K gate dielectric layer e.g., 14A and 14B, may be formed of aluminum-based high-K (e.g., $Al_2O_3$), hafnium-based high-K (e.g., $HfO_2$, HfSiO, HfON, or HfSiON), zirconium-based high-K (e.g., $ZrO_2$, ZrSiO, ZrON, or ZrSiON), yttrium-based high-K (e.g., $Y_2O_3$), lanthanum-based high-K (e.g., $La_2O_3$), cerium-based high-K (e.g., $CeO_2$), titanium-based high-K (e.g., $TiO_2$), tantalum-based high-K (e.g., $Ta_2O_5$), stack of these high-K film, or combinations thereof. Most of these high-K are metal-oxide type, or metal-silicate type; some of them are having nitrogen-incorporated or hydrogen-incorporated. The high-k dielectric layer may be formed by known chemical vapor deposition (CVD) methods, including atomic layer deposition (ALD), metal-organic CVD (MOCVD), low-pressure CVD (LPCVD), plasma-enhanced CVD (LPCVD); molecule beam epitaxy (MBE), or PVD method, including sputter.

The gate electrode portions e.g., 16A and 16B of the respective gate structures, 12A and 12B, are preferably formed of polysilicon, amorphous silicon, doped polysilicon, polysilicon-germanium, metal, silicide, metal-on-polysilicon, polysilicon-on-metal stack, or combinations thereof. For example, a lowermost interfacial oxide layer (, which can be ignored or skipped) is first formed over the substrate followed by depositing a high-K gate dielectric layer on the interfacial layer, followed by depositing an overlying gate electrode material, and then forming a hardmask layer (formed by silicon oxide, silicon nitride, or silicon oxynitride), photo resist, or combinations thereof (not shown) on the gate electrode material. Conventional lithographic patterning and dry etching are carried out to form the gate structures, e.g. 12A and 12B.

Figure 1B:
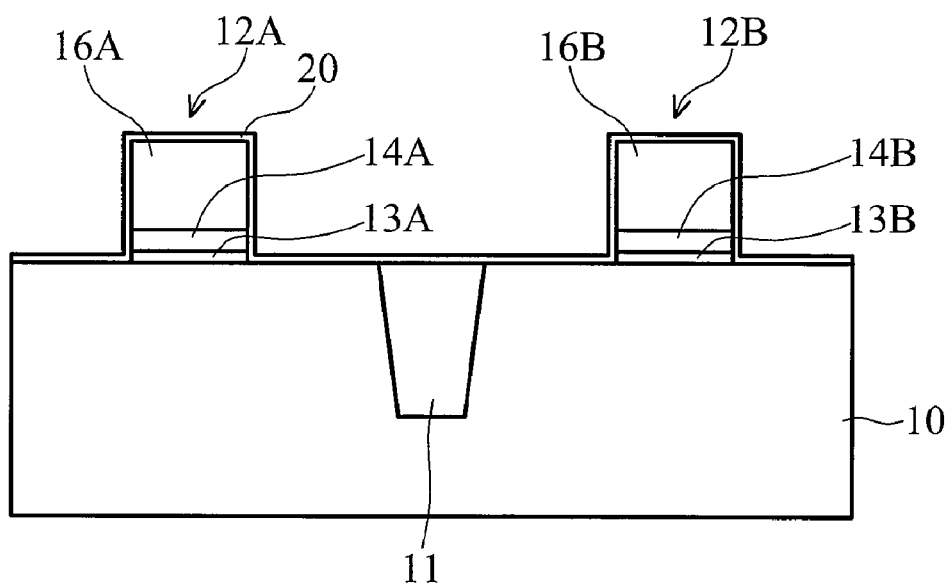

Referring to FIG. 1B, in an important aspect of the invention, a stressed oxygen-free dielectric layer 20, preferably a stressed nitride material (such as silicon nitride) and/or other suitable high-stressed oxygen-free material, is blanket deposited over the gate structures 12A and 12B in either compressive or tensile stress to exert a corresponding compressive or tensile strain on a channel region. For example it has been found that a tensile strain has an electrical performance enhancing effect, e.g., increased drive current, on NMOS devices while a compressive strain has an electrical performance enhancing effect on PMOS devices. On the other hand, a compressive strain may degrade NMOS device performance, while a tensile strain may degrade PMOS device performance. For example, if the stressed oxygen-free dielectric layer 20 is tensile, in the embodiment as shown, the gate structure 12B is an NMOS device and gate structure 12A is a PMOS device. For other example, if the stressed oxygen-free dielectric layer 20 is compressive, in the embodiment as shown, the gate structure 12A is an NMOS device and gate structure 12B is a PMOS device.

For example, a tensile or compressive stressed oxygen-free dielectric layer e.g., 20 may be formed by varying deposition parameters in a PECVD process, including using a mixed frequency RF power source. The relative frequencies and powers of the mixed frequency (e.g., dual frequency) RF power source components may be altered to achieve relatively tensile or compressive dielectric films. Other factors such as the thickness of the stressed dielectric layer, for example from about 10 Angstroms to about 500 Angstroms in thickness, can also be varied to achieve a desired stress level. In addition, the relative reactant flow rates, deposition pressures, and deposition temperatures, may be varied to alter the composition of the dielectric layer thereby further affecting a desired stress type and level, e.g., either a compressive or tensile stress up to a stress level of about 0.5~2 GPa.

For example, PECVD formation of a silicon nitride stressed layer e.g., 20, may be accomplished by supplying a precursor such as hexacholorodisilane (HCD) ($Si_2Cl_6$) and $NH_3$ at a deposition temperature of from about 300° C. to about 600° C., more preferably less than about 550° C., at pressures of from about 50 mTorr to about 5 Torr and mixed frequency RF powers of from about 100 Watts to about 3000 Watts. Silane precursors such as hexacholorodisilane (HCD) ($Si_2Cl_6$), silane ($SiH_4$), disilane ($Si_2H_6$), trisilane ($Si_3H_8$), dichlorosilane ($SiH_2Cl_2$), trichlorosilane ($SiHCl_3$), or combinations thereof may be used in the PECVD process.

Figure 1C:
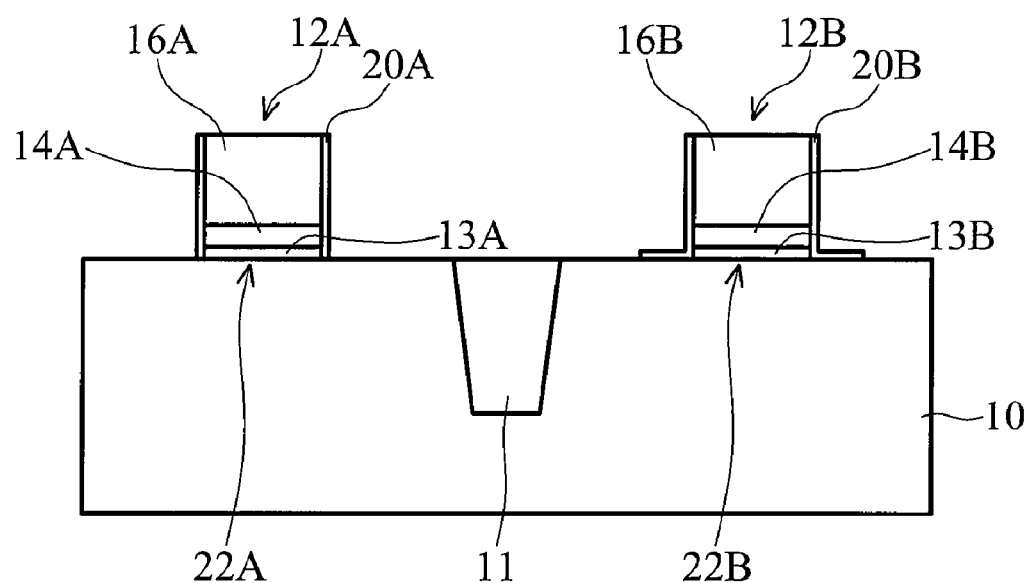

Referring to FIG. 1C, following deposition, a patterned photoresist layer (not shown) is formed over the stressed oxygen-free dielectric layer 20, followed by a wet or dry etchback process, preferably a dry etchback process, to form spacer portions such as an I-shaped oxygen-free offset spacer 20A and an L-shaped oxygen-free offset spacer 20B over selected gate structures depending on the polarity of the gate structure and the stress type of the stressed oxygen-free dielectric layer 20. For example, if the gate structure 12A is formed for NMOS (N type polarity) device, the oxygen-free dielectric layer 20 is deposited in compressive stress, and an I-shaped oxygen-free offset spacer e.g., 20A is preferably formed adjacent either side of the gate structure to line only the gate structure sidewalls thereby minimizing the amount of compressive strain imposed on the channel region 22A. On the other hand, if the oxygen-free dielectric layer 20 is deposited in tensile stress, an L-shaped oxygen-free offset spacer e.g., 20B (for NMOS device) is preferably formed adjacent either side of the gate structure 12B to both line the gate structure sidewalls and cover a portion of the adjacent substrate to maximize the amount of tensile strain imposed on the channel region 22B. It will be appreciated that the opposite relationship of preferred spacer is formed in PMOS (P type polarity) device.

As shown in FIG. 1C, the stressed oxygen-free dielectric layer 20 is formed in compressive stress, the I-shaped oxygen-free offset spacer e.g., 20A is formed adjacent either side of the NMOS gate structure 12A and an L-shaped oxygen-free spacer e.g., 20B is formed adjacent either side of the PMOS gate structure 12B. It will be appreciated that a portion of the stressed oxygen-free dielectric layer 20 may remain covering a top portion of the gate structure 12B following the etchback process to form the L-shaped oxygen-free spacer 20B, the top portion being later removed after the formation of the L-shaped oxygen-free spacer 20B region.

Figure 1D:
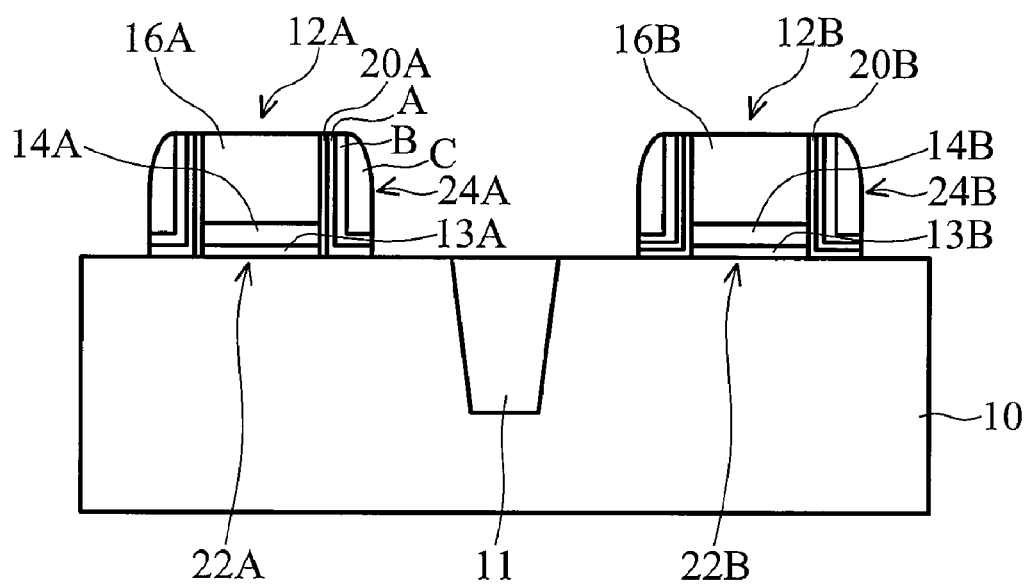

Referring to FIG. 1D, a main spacer portion including a multi-layer composite of oxide/nitride is then formed adjacent the I-shaped oxygen-free offset spacer (e.g., 20A) and the L-shaped oxygen-free offset spacer (e.g., 20B) portions. For example, as shown in FIG. 1D, in one embodiment, the main spacer portion is an oxide/nitride/oxide (ONO) type spacer. (In other example, the main spacer is an oxide, oxide/nitride, nitride/oxide, or nitride spacer (not shown).) A first oxide layer, for example, LPCVD TEOS oxide, is first blanket deposited, followed by deposition of a nitride layer, for example silicon nitride or silicon oxynitride (e.g., SiON), by an LPCVD process, followed by deposition of another oxide layer. A series of etching steps including conventional wet and/or dry etchback processes are then carried out to form the main spacer portions (e.g., 24A and 24B, including first and second oxide layers A and C and intervening nitride layer B).

Figure 1E:
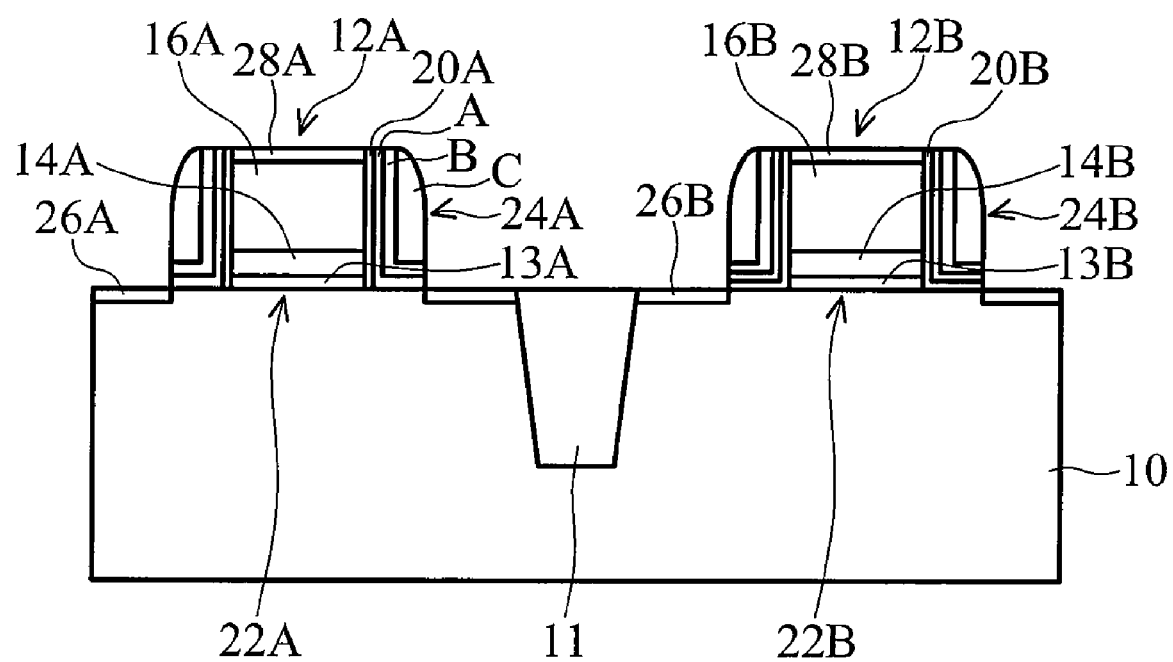

Referring to FIG. 1E, following the main spacer formation process, conventional processes are then carried to complete formation of the NMOS and PMOS device pair. For example, a high dose implant is carried out to form source/drain doped regions in the substrate (not shown) and metal silicide regions e.g., 26A and 26B are formed over the S/D regions as well as optionally forming metal silicide regions e.g., 28A and 28B, over the upper portion of the gate electrodes. The metal silicide regions may be formed of titanium silicide, cobalt silicide, or nickel silicide by conventional self aligned silicide formation processes including depositing Ti, Co, or Ni over exposed silicon and polysilicon portions followed by a subsequent annealing process to form the low resistance phase of the respective metal silicide.

Thus, a method for producing offset oxygen-free spacer portions in a CMOS device manufacture process has been presented that allows adjustable control over an amount of stress (strain) (e.g., compressive or tensile) delivered to a NMOS or PMOS device channel region. Advantageously, the formation of I-shaped oxygen-free offset spacer or L-shaped oxygen-free offset spacer simultaneously serves to seal the sidewalls of the high-K dielectric layer portions against oxygen influx thereby protecting the high-K gate dielectric stack from performance degrading oxidation (or sub-oxide formation) effects including intervening oxide layer formation (e.g., between gate electrode and high-K dielectric).

In addition, a MOSFET pair comprising respective PMOS and NMOS devices is also presented in FIG. 1E, the MOSFET pair comprises a semiconductor substrate comprising an NMOS gate structure and a PMOS gate structure, each comprising a high-K gate dielectric. A plurality spacer portions is formed adjacent to either side of the respective gate structures comprising a stressed dielectric layer for inducing a desired strain on a respective channel region while sealing respective high-K gate dielectric sidewall portions. A plurality of main sidewall spacers is formed adjacent to the spacer portions.

Figure 2:
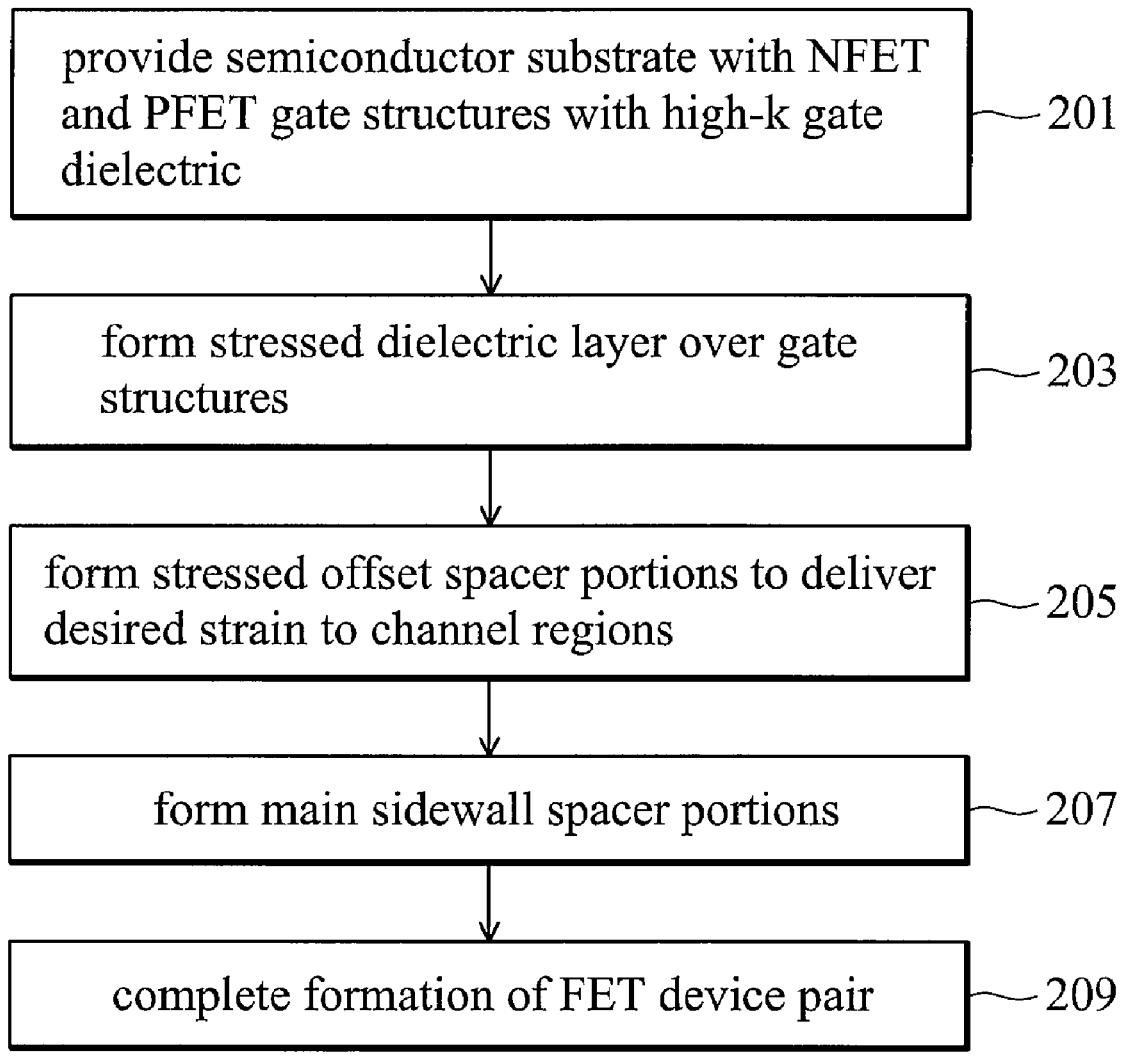
FIG. 2 is a process flow diagram including several embodiments of the present invention.

Referring to FIG. 2 is a process flow diagram including several embodiments of the present invention. In process 201, a semiconductor substrate including overlying gate structures for MOSFET devices having a respective PMOS (P type polarity) device and NMOS (N type polarity) device is provided. In process 203, a stressed dielectric layer (either tensile or compressive) is formed over the gate structures and adjacent substrate portions. In process 205, the stressed dielectric layer is etched back to form spacer portions (e.g., I-shaped oxygen-free offset spacer and L-shaped oxygen-free spacer) adjacent respective gate structures to deliver a desired strain to a respective channel region. In subsequent process 207, main sidewall spacer portions are formed adjacent the I-shaped offset spacer and L-shaped spacer portions and such as an S/D ion implant and metal silicide formation are carried out to complete formation of the MOSFET device pair.

The preferred embodiments, aspects, and features of the invention having been described, it will be apparent to those skilled in the art that numerous variations, modifications, and substitutions may be made without departing from the spirit of the invention as disclosed and further claimed below.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor device pair comprising:
    a semiconductor substrate comprising a first gate structure with a first type polarity and a second gate structure with a second type polarity, the first and the second gate structures comprise a high-K gate dielectric and a lowermost interfacial layer formed between the high-K gate dielectric and the semiconductor substrate, wherein the lowermost interfacial layer physically contacts the semiconductor substrate and the high-K gate dielectric; and
    a plurality of oxygen-free offset spacer portions adjacent either side of the respective first and second gate structures, each comprising a stressed dielectric layer physically contacting the either side of the respective first and second gate structures, to induce a desired strain on a respective channel region while sealing respective high-K gate dielectric sidewall portions, wherein the oxygen-free offset spacer portions adjacent either side of the first gate structure and the oxygen-free offset spacer portions adjacent either side of the second gate structure are formed with different shapes.

2. The semiconductor device pair of claim 1, wherein the oxygen-free offset spacer portions are I-shaped or L-shaped spacers covering sidewalls of the first gate structure or the second gate structure.

3. The semiconductor device pair of claim 1, wherein the stressed dielectric layer comprises nitrogen element but free of oxygen element.

4. The semiconductor device pair of claim 1, wherein the stressed dielectric layer comprises silicon nitride.

5. The semiconductor device pair of claim 1, further comprising a main spacer formed adjacent to the stressed dielectric layer of the first gate structure and the second gate structure, wherein the main spacer comprises oxide and nitride layers.

6. The semiconductor device pair of claim 1, wherein the stressed dielectric layer is tensile or compressive stressed.

7. A semiconductor device, comprising:
    a semiconductor substrate comprising an NMOS gate structure and a PMOS gate structure formed thereon, each comprising a high-K gate dielectric and a lowermost interfacial layer formed between the high-K gate dielectric and the semiconductor substrate, wherein the lowermost interfacial layer physically contacts the semiconductor substrate and the high-K gate dielectric; and
    a compressive stressed dielectric layer formed over a sidewall of the NMOS gate structure and a PMOS gate structure, wherein the compressive stressed dielectric layer is oxygen-free and physically contacts the sidewall of the NMOS gate structure and the PMOS gate structure to seal the high-K gate dielectric edge in the NMOS/PMOS gate structure, the compressive stressed dielectric layer formed over the sidewall of the NMOS gate structure is I-shaped, and the compressive stressed dielectric layer formed over the sidewall of the PMOS gate structure is L-shaped.

8. The semiconductor device of claim 7, wherein the compressive stressed dielectric layer comprises nitrogen element but free of oxygen element.

9. The semiconductor device of claim 7, wherein the compressive stressed dielectric layer comprises silicon nitride.

10. The semiconductor device of claim 7, further comprising a main spacer formed adjacent to the compressive stressed dielectric layer of the NMOS gate structure and the PMOS gate structure, wherein the main spacer comprises oxide and nitride layers.

11. The semiconductor device of claim 7, wherein the high-K gate dielectric comprises a material selected from the group consisting of aluminum-based high-K, hafnium-based high-K, zirconium-based high-K, yttrium-based high-K, lanthanum-based high-K, cerium-based high-K, titanium-based high-K, tantalum-based high-K, stack of these high-K film, or combinations thereof.

12. A semiconductor device, comprising:
  a semiconductor substrate comprising an NMOS gate structure and a PMOS gate structure formed thereon, each comprising a high-K gate dielectric and a lowermost interfacial layer formed between the high-K gate dielectric and the semiconductor substrate, wherein the lowermost interfacial layer physically contacts the semiconductor substrate and the high-K gate dielectric; and
  a tensile stressed dielectric layer formed over a sidewall of the NMOS gate structure and a PMOS gate structure, wherein the tensile stressed dielectric layer is oxygen-free and physically contacts the sidewall of the NMOS gate structure and the PMOS gate structure to seal the high-K gate dielectric edge in the NMOS/PMOS gate structure, the tensile stressed dielectric layer formed over the sidewall of the NMOS gate structure is L-shaped, and the tensile stressed dielectric layer formed over the sidewall of the PMOS gate structure is I-shaped.

13. The semiconductor device of claim 12, wherein the tensile stressed dielectric layer comprises nitrogen element but free of oxygen element.

14. The semiconductor device of claim 12, wherein the tensile stressed dielectric layer comprises silicon nitride.

15. The semiconductor device of claim 12, further comprising a main spacer formed adjacent to the tensile stressed dielectric layer of the NMOS gate structure and the PMOS gate structure, wherein the main spacer comprises oxide and nitride layers.

16. The semiconductor device of claim 12, wherein the high-K gate dielectric comprises a material selected from the group consisting of aluminum-based high-K, hafnium-based high-K, zirconium-based high-K, yttrium-based high-K, lanthanum-based high-K, cerium-based high-K, titanium-based high-K, tantalum-based high-K, stack of these high-K film, or combinations thereof.

17. The semiconductor device pair of claim 1, wherein the oxygen-free offset spacer portions comprise the stressed dielectric layer for inducing the same type of stress.

* * * * *